United States Patent [19]
Baker et al.

[11] Patent Number: 5,724,653
[45] Date of Patent: Mar. 3, 1998

[54] RADIO RECEIVER WITH DC OFFSET CORRECTION CIRCUIT

[75] Inventors: Thomas Wesley Baker, Orefield; Paul Cooper Davis, Reading; Douglas D. Lopata, Boyertown, all of Pa.; Owe George Petersen, Brookfield, Wis.; Trudy Dawn Stetzler, Reading, Pa.

[73] Assignee: Lucent Technologies Inc., Murray Hill, N.J.

[21] Appl. No.: 359,782

[22] Filed: Dec. 20, 1994

[51] Int. Cl.$^6$ .................................. H04B 1/12
[52] U.S. Cl. .................. 455/296; 455/207; 455/209; 455/278.1; 455/310; 455/312; 375/319; 375/346; 375/349
[58] Field of Search .................. 455/207, 209, 455/296, 324, 205, 278.1, 78, 214, 216, 303, 304, 310, 312, 337, 338, 314, 318; 375/319, 346, 349

[56] References Cited

U.S. PATENT DOCUMENTS

| | | |
|---|---|---|
| 4,776,039 | 10/1988 | Akaiwa .................. 455/205 |
| 5,128,966 | 7/1992 | Bang .................. 455/214 |
| 5,196,806 | 3/1993 | Ichihara . |
| 5,212,826 | 5/1993 | Rabe et al. . |
| 5,222,253 | 6/1993 | Heck .................. 455/78 |
| 5,241,702 | 8/1993 | Dent . |
| 5,291,474 | 3/1994 | Ikonen et al. . |
| 5,309,501 | 5/1994 | Kozik et al. . |
| 5,471,665 | 11/1995 | Pace et al. .................. 455/209 |

*Primary Examiner*—Reinhard J. Eisenzopf
*Assistant Examiner*—Doris To

[57] ABSTRACT

The present invention relates to a radio receiver adapted for use in a time division multiple access (TDMA) system. The radio receiver includes DC compensator circuits configured to decrease the time required to cancel DC offset before received data bursts by DC coupling a radio frequency (RF) demodulator to a baseband channel. The radio receiver may also employ AC capacitive coupling having time modification so as to increase the AC coupled setting time and provide a low pole in a RF-to-Baseband interface.

10 Claims, 4 Drawing Sheets

RADIO RECEIVER WITH DC OFFSET CORRECTION CIRCUIT

BACKGROUND OF THE INVENTION

1. Field of the Invention

The present invention relates to RF radio receivers and more particularly to a circuit configured to decrease DC offset of input signals in a digital radio receiver.

2. Description of the Prior Art

Digital radio receivers include an antenna which receives radio frequency signals and converts them into electrical radio frequency signals. These radio frequency signals are then reduced to a lower frequency signal for amplification in an intermediate frequency (IF) stage. In the intermediate frequency stage, the signal received from the antenna is amplified and bandpass filtered before it is processed further in a baseband section. The baseband section typically includes a common mode level shifting amplifier coupled to an analog-to-digital converter (A/D) and a filtering section. Preceding the aforementioned baseband section is a RF demodulator which down-converts the incoming RF signal to an intermediate frequency range. The intermediate frequency signal is then split and input to a quadrature demodulator. The quadrature demodulator is operative to reduce the frequency of the input signal to its baseband frequency, and subsequently prepares the signal for extraction of data information.

Ideally, the baseband section has no DC offset, and the DC component of the baseband signal is due to the DC component of the transmitted signal. However, in practical implementations, there is DC offset present in the RF demodulator due to the inherent mismatches of radio components and/or local oscillator leakage. In addition, the baseband section is typically implemented with transistors and resistors whose mismatches add to the total DC offset in the channel. This undesired DC offset is often acceptable for conventional analog radio receivers, however, digital radio receivers have a lower tolerance to offset errors, in contrast to conventional analog radio receivers. This inherent DC offset in a digital radio receiver, left uncorrected, is operative to add a DC error to the output signal and limit the dynamic range of the digital radio receiver.

Since the RF demodulator DC offset can be relatively large and is further increased by the gain in subsequent stages in the baseband section, the RF demodulator offset must be either blocked or corrected. One conventional technique is to prevent the transmission of DC offsets from the RF section is to capacitively couple the interface between the RF and baseband sections. Thus, in the steady-state condition, no DC signals are passed and the RF demodulator DC offset is blocked. However, this technique in its most basic form effects a transient settling time problem in system implementations where power down occurs between successive received data bursts. It is noted that powering down between data bursts is desirable to decrease power and increase talk time in similar applications that employ time division multiple access (TDMA) channels.

Further, to ensure that most of the AC signal energy is passed through the interface, the maximum pole frequency resulting from the coupling capacitor and the baseband input impedance (consuming low RF output stage impedance at those frequencies) must be limited to at most a few hundred hertz. Thus, the settling time required to charge these capacitors to their final DC values prior to the reception of valid burst data can be tens or hundreds of milliseconds.

However, in the GSM standard (global systems for mobile communication standard), there is less than one millisecond between receive/monitor bursts. Therefore, a faster settling technique to prevent the transmission of DC offsets as previously accomplished by the prior art technique is required in such a GSM standard. Thus, there exists a need to correct in an extremely short time for the undesired DC offset, particularly in a GSM digital radio receiver.

SUMMARY OF THE INVENTION

The present invention relates to a radio receiver for receiving an input signal and demodulating the input signal into inphase (I) and quadrature (Q) signals, wherein the input signal contains a DC offset. The radio receiver includes an antenna for receiving an input radio signal from a fixed site transmitter and a mixer coupled to the antenna for generating an intermediate frequency (IF) signal from the input radio signal. An AC coupling capacitor couples the mixer to a demodulation circuit which is configured to demodulate the IF signal into respective inphase (I) and quadrature (Q) signals.

The demodulation circuit includes first and second mixers for converting the IF signal into the respective I and Q signals. The demodulation circuit further includes first and second DC correction circuits each including a low pass filter which are respectively coupled to the first and second mixers. The first and second DC correction circuits are adapted to store DC offset associated with the first and second mixers prior to the reception of an input radio signal. The first and second DC correction circuits are further adapted to subtract the aforementioned stored DC offset from the I and Q output signals of the first and second mixers during reception of the input radio signals.

The radio receiver according to the present invention further includes a programmable gain amplifier adapted to amplify a baseband signal and an anti-alias filter for compensating for aliasing error distortion due to undersampling of the amplified baseband signal. An analog-to-digital (A/D) converter is coupled to the anti-alias filter for converting the analog output signal of the anti-alias filter to a digital signal. Further, a decimation and filtering circuit is coupled to the A/D converter so as to decimate the output digital signal from the A/D converter. A DC compensator circuit is coupled to the input terminals of the programmable gain amplifier and is adapted to store DC offset associated with the baseband signal and subtract this stored DC offset from the input baseband signal to the programmable gain amplifier.

BRIEF DESCRIPTION OF THE DRAWINGS

The foregoing features of the present invention will become more readily apparent and may be understood by referring to the following detailed description of an illustrative embodiment of an apparatus according to the present invention, taken in conjunction with the accompanying drawings, in which.

DETAILED DESCRIPTION OF THE PREFERRED EMBODIMENT(S)

Figure 1:
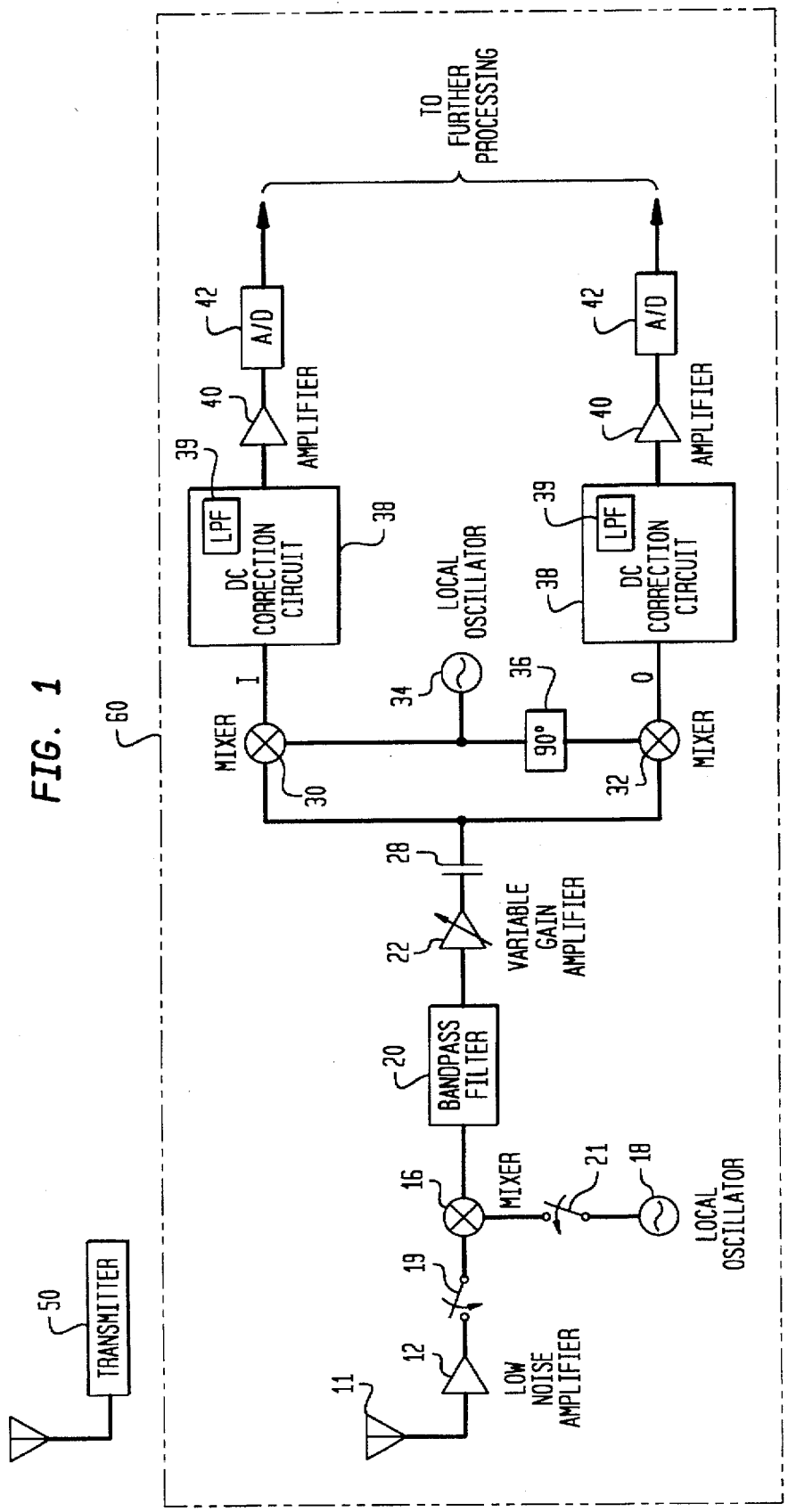
FIG. 1 is a circuit diagram of a single intermediate frequency signal path of a digital radio receiver in accordance with the present invention.

Referring now to the drawings, in which like reference numerals identify similar or identical elements, FIG. 1 illustrates a single intermediate frequency (IF) path according to the present invention, designated generally by reference numeral 10. The single IF path 10 is adapted to be preferably implemented in numerous digital radio receivers hereby incorporated by reference. As will be described in greater detail below, the single IF path 10 is configured to be implemented in a RF demodulating section of a digital radio receiver 60 and is operative to down-convert a RF signal into a single IF signal and subsequently demodulate the IF signal into its baseband inphase (I) and quadrature (Q) signals. Briefly, the single IF path 10 includes a low noise amplifier 12, a mixer 16, local oscillator (LO) 18, bandpass filter 20 and a variable gain amplifier 22. It is noted that the preferred embodiment encompasses a radio frequency system conveying radio frequency signals between a transmitter 50 and the receiver 60 incorporating the single IF path 10 of the present invention. Preferably, the transmitter 50 is a fixed site radio transmitter. However, it is to be appreciated that transmitter 50 is not to be limited to such a fixed site radio transmitter, but rather may be incorporated into any transmitter (i.e., a mobile transmitter).

The manner in which the single IF path 10 down-converts a transmitted RF signal into a single IF signal, and subsequently demodulates the IF signal into baseband I and Q signals will now be described with reference to FIG. 1. First, the antenna 11 transduces the radio frequency signals into electronic radio frequency (RF) signals. The RF signal is then amplified through the low noise amplifier 12 and is coupled to the mixer 16, via closed switch 19. A second switch 21 is closed so as to enable the local oscillator (LO) 18 signal to be coupled to the mixer 16. Mixer 16 is operative to mix the local oscillator 18 frequency with the incoming radio frequency signals reducing the frequency data to an IF signal. The output of the mixer 16 is an IF signal which is then filtered by the bandpass filter 20 coupled to the mixer 16. The aforementioned bandpassed IF signal is then amplified in the variable gain amplifier 22 coupled in series with the bandpass filter 20. The variable gain amplifier 22 is operative to amplify the IF signals to the correct voltage levels so as to avoid saturation and be a suitable level for interpretation by the remaining circuitry in the receiver 60. As is conventional, the variable gain amplifier 22 is controlled by the measured power of the incoming radio frequency signals. Further, the IF signal is AC coupled to a quadrature demodulating circuit, via capacitor 28. The capacitor 28 is functional to block the DC component in the bandpassed IF signal.

The aforementioned quadrature demodulator circuit includes mixers 30 and 32 which are both coupled to a local oscillator 34 operating with an intermediate frequency (IF). The frequency of local oscillator 34 is shifted 90° by the phase shifter 36 coupled to mixer 32. Therefore, the combinations of the mixers 30 and 32, the local oscillator 34 and the phase shifter 36 are operative to produce two signals 90° out of phase with each other. The two output signals are hereinafter referred to as the inphase (I) and quadrature (Q) signals. Further, the respective I or Q baseband signals contain an AC component which includes the information signal, and a DC component which is the demodulation of the carrier component of the aforementioned IF signal. The I and Q data signals are baseband signals which are interpreted by the baseband circuitry of the receiver 60 to form digital data to be used by the radio telephone system. To avoid repetition, only the inphase signal (I) circuits are shown from this point since the I and Q circuits are identical to one another.

As is conventional, RF signals typically have a small DC carrier component along with the information component since commercially available RF transmitters are not ideal. In conventional integrated receivers, a small amount of the local oscillators 34 intermediate frequency signal typically leaks to the variable gain amplifier 22. In the present invention, the aforementioned leaked local oscillator intermediate frequency signal is amplified by the variable gain amplifier 22 and is coupled to mixer 30, via capacitor 28. The mixer 30 is operative to demodulate the local oscillator IF signal to a DC level. The combined DC offset and AC information signal are then directly coupled through a DC correction circuit 38 to an amplifier 40, wherein the output of the amplifier 40 is directly coupled to an A/D converter 42. The aforementioned direct coupling saves power compared to a conventional AC coupling approach, because with the aforementioned direct coupling scheme, amplifier 40 and A/D converter 42 are turned off between data pulses received by a digital receiver 60 implementing the IF path 10 of the present invention. Further, since the amplitude of the aforementioned DC offset can be significant relative to the amplitude of the AC information signal, the dynamic range of the A/D converter 42 is significantly reduced. The amplitude of the DC offset is directly proportional to the gain setting of the variable gain amplifier 22 and will change in correspondence to a change in the gain setting of amplifier 22.

Figure 2:
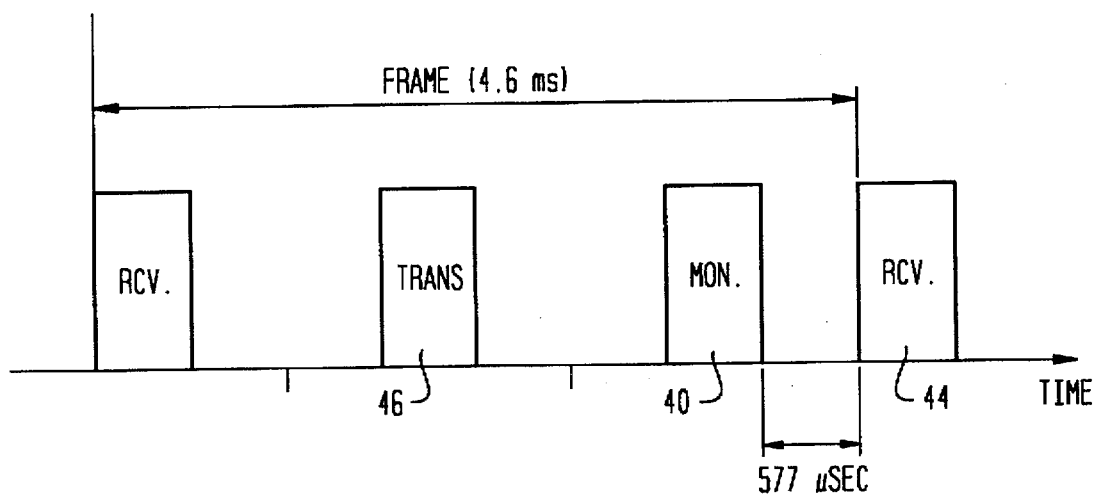
FIG. 2 is a diagram of a time slot configuration used in a time division multiple access (TDMA) transmission system.

In a global system for mobile communications standard (GSM), the radiotelephone system transmits and receives time division multiple access data. In a TDMA system, the radiotelephone only sends data to and receives data from the fixed transceiver 50 in certain "bursts" (time slots). An example of a TDMA transmit and receive scheme is shown in FIG. 2. In GSM, a "receive" burst 44 is received which carries the information of the cellular telephone. A "Transmit" burst 46 follows the "Receive" burst 44, so as to transmit data in a predefined time slot (preferably, 0.577 msec). Prior to every "Receive" burst 44, and after every "Transmit" burst 46 is a "Monitor" function 40 which performs an RF power measurement function, as is well known. Immediately after the "Monitor" function 40 is a period of "Dead" time (0.577 msec) wherein no RF functions are performed. Since the "Monitor" function 40 and "Receive" burst 44 occur only 0.577 msec apart from one another and since within this time period the receiver 50 must change frequency and gain, a burden is placed on the receiver circuitry to quickly adjust to the correct DC bias voltage to avoid distorting the received data. Since succeeding pulses may not be from the same transmitter, the aforementioned single IF path 10 must be calibrated such that, the gain of the variable amplifier 22 (FIG. 1) is accordingly adjusted to optimize the signal level to enable maximum dynamic range for the A/D converter 42. Therefore, the gain of the variable amplifier 22 for the "Receive" burst 44 time slot is constantly adjusted and maintained by continuing to monitor the baseband signal, including any DC, over a succession of "Receive" bursts 44. Further, the gain is constantly adjusted to a different value during the "Monitor" function 40, using the above described procedure in reference to the "Receive" burst 44. Thus, different gain settings effect different DC offsets for succeeding bursts.

Referring back to FIG. 1, prior to each aforementioned "Receive" 44 and "Monitor" burst 40, the DC output of the mixer 30 is stored in the DC correction circuit 38 (which includes a sample and hold circuit) and is subtracted from the output of mixer 30 during each aforementioned data burst. In furtherance of the calibration of the single IF path 10, the received RF signal is removed by opening respective switches 19 and 21 which is functional to prevent the mixer 16 from receiving the respective signals from antenna 11 and local oscillator 18, as well as to enable instantaneous sampling so as to capture the peak of the noise signal from the variable gain amplifier 22. It is noted that since the noise bandwidth of the variable gain amplifier 22 may be large and not limited by the IF bandpass filter 20, a lowpass filter (LPF) 39 may be incorporated into the DC correction circuit 38 to reduce the aforementioned noise bandwidth and prevent erroneous samples. The aforementioned lowpass filter would preferably be configured to settle during a calibration burst time (approximately 0.5 ms), while its bandwidth would still be much less than the aforementioned baseband (i.e., 100 KHz). Therefore, the resultant output referred (at the output of the A/D converter 42) error in corrected DC offset due to the noise in the channel is less than 1 LSB (least significant bit) with maximum gain in 60 (the entire digital radio channel).

Figure 3:
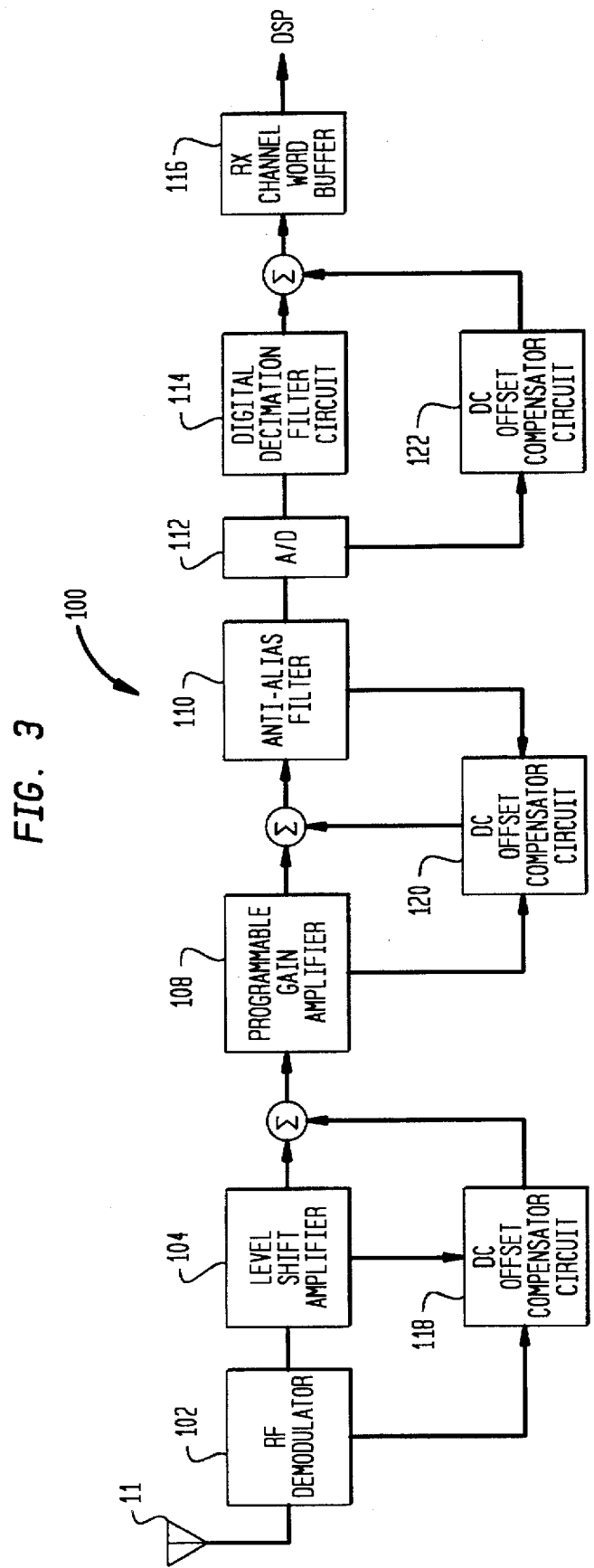
FIG. 3 is a block diagram of a baseband converter section of the digital radio receiver of FIG. 1 embodying the present invention.

With the single IF path 10 for an RF section of a digital radio receiver 60 being described above, discussion will now turn in reference to a DC direct coupled interface circuit according to the present invention and illustrated in the block diagram schematic circuit of FIG. 3, designated generally by reference numeral 100. The direct coupled interface circuit 100 is configured to be implemented in the baseband converter section of the digital radio receiver 60, in conjunction with the above described single IF path circuit 10. As will be described in greater detail below, the interface circuit 100 is operative to decrease the time required to cancel DC offset between the aforementioned data bursts in a digital radio receiver 60.

The direct coupled interface circuit 100 is coupled to the RF demodulator section 102 of receiver 60 (FIG. 1) incorporating the above described single IF path 10. The direct coupled interface circuit 100 includes a level shifting amplifier 104 which is functional to adjust the input signal to a nominal DC bias level, and is coupled to a programmable gain amplifier 108 which in turn is coupled to an anti-alias filter 110. The programmable gain amplifier 108 is functional to adjust the signal gain of the input signal, via antenna 11, to a level suitable for processing, as is well known, while the anti-alias filter 110 is functional to compensate for the alias error introduced onto the baseband signal due to undersampling thereof. An analog-to-digital converter (A/D) 112 is coupled both to the anti-alias filter 110 and to a digital decimation and filter circuit 114 and is operative to convert the output analog signal of the anti-alias filter 110 to a digital signal which is input to the digital decimation and filter circuit 114. The digital decimation and filtering circuit 114 is coupled to a RX channel word buffer 116 whose output is connected to a digital signal processor (not shown). The digital decimation and filtering circuit 114 is operative to convert the output of the A/D converter 112 to digital word samples, as is well known. It is to be appreciated that the above mentioned components are all readily known to one ordinarily skilled in the art and are configured to form the aforementioned baseband converter section of the GSM digital radio receiver 60.

To eliminate any DC offset (i.e. residual DC offset), the direct coupled interface circuit 100 includes DC offset compensator circuits 118, 120 and 122. DC offset compensator 118 is coupled intermediate the level shifting amplifier 104 and programmable gain amplifier 108 and is adapted to remove any DC offset created or passed by the RF demodulator 102 and level shifting amplifier 104. The DC offset compensator 120 is coupled intermediate the programmable gain amplifier 108 and anti-alias filter 110 and is adapted to remove any DC offset created or passed by the programmable gain amplifier 108 and anti-alias filter 110 and any residual offset from DC offset compensator circuit 120. The DC offset compensator circuit 122 preferably includes a digital offset storage register which is coupled to the output of the digital decimation and filtering circuit 114 and is adapted to remove any DC offset created or passed by the A/D converter 112. The operations of the DC offset compensator circuits 118, 120 and 122 will be further described below. It is to be appreciated that if the dynamic range of the programmable gain amplifier 108 is not limited, the DC offset compensator circuit 118 is not required. In this configuration, the DC offsets of the RF demodulator 102, common mode level shifter amplifier 104, programmable gain amplifier 108 and anti-alias filter 110 can be stored and corrected by DC compensator circuit 120.

With continued reference to FIG. 3, the cancellation of the DC offset in the direct coupled interface circuit 100 substantially occurs in two phases. In reference to a first phase, during the digital radio receiver's 60 power up cycle, or at the user's request, the digital offset storage register of the DC offset compensator circuit 122 stores the DC offset produced by the A/D converter 112 as a digital word. The aforementioned digital word (the DC offset of the A/D converter 112) is subtracted from each output digital value of the digital decimation and filtering circuit 114 prior to storage in the RX channel word buffer 116. Therefore, the DC offset of the A/D converter 112 is cancelled from the output signal of the digital decimation filter circuit 114, via the DC offset compensator circuit 122.

In reference to the remaining DC offset compensator circuits 118 and 120, the below described DC offset cancellation phase occurs prior to every "Receive" burst 44, or "Monitor" function 40 as described above (FIG. 2), when DC offset cancellation is requested by the user. The baseband receiver section 60 (FIG. 1) is powered up approximately 500 μs prior to a "Receive" burst 44 so as to complete the below described offset storage steps. Further, a long pre-burst power up is required to both filter and reduce the peak noise on an incoming demodulator offset signal to a sufficient level which enables accurate storage at the inputs to the baseband programmable gain amplifier 108.

The DC offset compensator circuit 118 is preferably adapted to store DC offset from both the RF demodulator 102 and the level shifter amplifier 104 prior to each "Received" data burst 44 (FIG. 2). The aforementioned DC offsets of the level shifter amplifier 104 and RF demodulator 102 are preferably stored in an input capacitor placed across a second differential pair at the inputs to the programmable gain amplifier 108. Thus, the voltage offset is subtracted from the input signal to the programmable gain amplifier 108, via the DC offset compensator circuit 118.

The DC offset compensator circuit 120 is adapted to store DC offset from the programmable gain amplifier 108, the anti-alias filter 110, and the residual offset from DC offset compensator circuit 118. It is noted that DC offset compensator circuits 118 and 120 are in an active storage configuration simultaneously. Therefore, any residual errors caused by the non-ideality of DC offset compensator circuit 118 are compensated by the DC offset compensator circuit 120. Further, the output DC offset of the anti-alias filter 110, including the output DC offset of the programmable gain amplifier 108, are stored in the DC offset compensator circuit 120, via preferably an input capacitor (not shown) which is placed across a second differential pair at the inputs to the anti-alias filter 110. This aforementioned DC offset voltage is then subtracted from the input signal to the anti-alias filter 110, via the DC offset compensator circuit 120.

Figure 4:
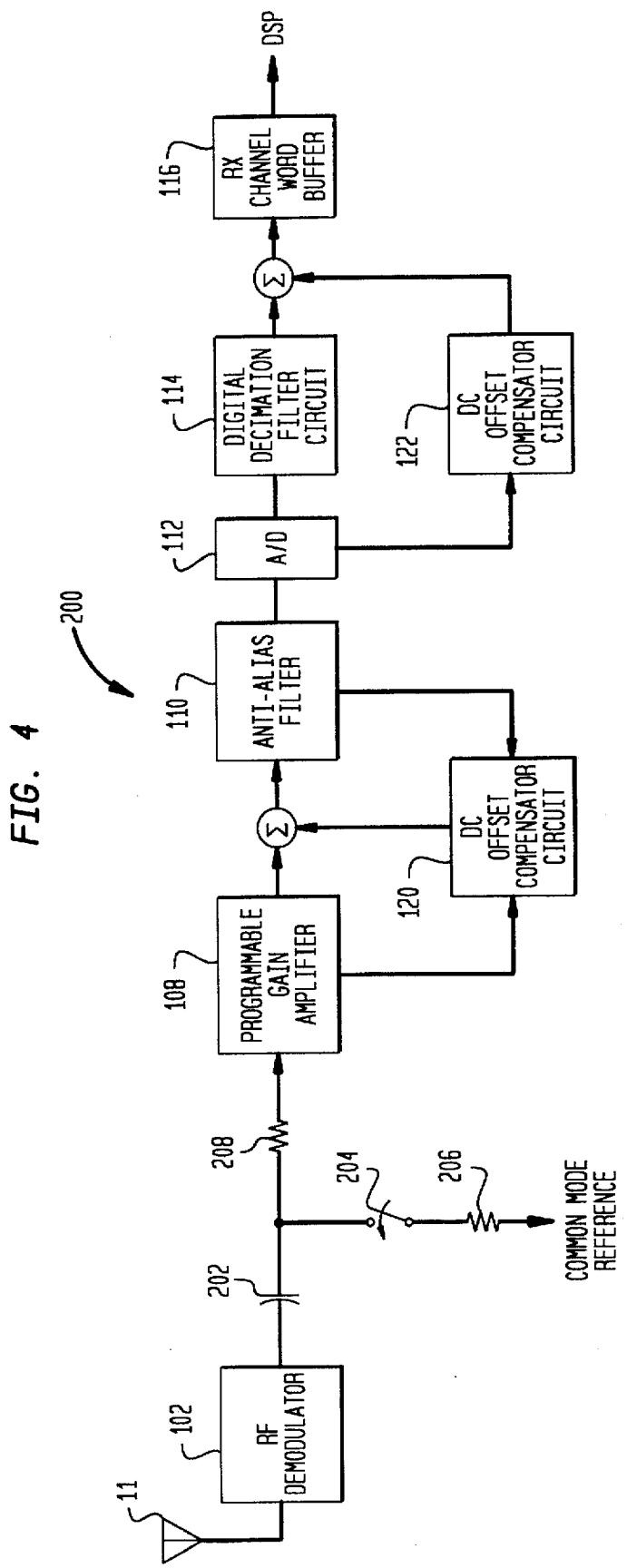
FIG. 4 is an alternative embodiment of the baseband converter section of FIG. 3.

In another preferred embodiment of the DC offset correction circuit according to the present invention, FIG. 4 illustrates a capacitively coupled interface circuit 200 having time constant modification. Interface circuit 200 is substantially identical to interface circuit 100 (FIG. 3) except for the exclusion of the level shifting amplifier 104 and DC compensator circuit 118 and the provision of capacitor 202, switch 204 and resistors 206 and 208.

Capacitor 202 is operative to block DC signals between the baseband converter section 250 and RF demodulator 102 when the interface circuit 200 is in a steady-state condition. The resultant pole which is formed between capacitor 202 and resistor 208 is configured to be low enough to pass the low frequency signal energy of the RF Demodulator 102 through interface circuit 200. However, the aforementioned low frequency pole inherently implies a long time constant and settling time before DC offset signals settle. Further, the aforementioned long settling time effects transient power up and down difficult to achieve at GSM TDMA frame rates whereby the DC offset and common mode voltage do not have sufficient time to settle.

The above mentioned settling time problem is obviated in the present invention interface circuit 200 by modifying the tau (τ) of the time constant of the RC circuit which is formed by capacitor 202 and resistor 208. Preferably, the resistor 208 is to be further representative of the input resistance of the programmable gain amplifier 108. Further, the input impedance of the programmable gain amplifier 108 is reduced by closing switch 204 which effects capacitor 202 to be coupled to resistor 206, wherein the resistance of resistor 206 is of a smaller value than the resistance of resistor 208. Since τ is reduced, the RF demodulator 102 and baseband can be powered up early enough to enable DC voltages to settle on the coupling capacitor 202, which block the occurrence of a DC signal from the RF demodulator 102. Therefore, the coupling capacitor 202 becomes the DC offset storage element, in contrast to the DC offset compensator circuit 118 of FIG. 1. Further, the resistor 206 can be configured of a resistance which generates a pole frequency low enough to permit noise filtering during DC offset storage on capacitor 202 and is further coupled to a common mode reference point (not shown).

The DC offset cancellation operation of the interface circuit 200 is identical to that of interface circuit 100 (FIG. 3) as described above except for the DC offset cancellation of the RF demodulator 102. The DC offset of the RF demodulator 102 is stored in the interface circuit 200 prior to every received data burst (FIG. 2). The RF demodulator 102 which includes the above described single IF path 10, is configured to present its DC offset to the input of the programmable gate amplifier 108. The switch 204 is closed so as to reduce the RC (202, 208) time constant, as described above.

While the invention has been particularly shown and described with reference to preferred embodiments, it will be understood by those skilled in the art that various modifications in form and detail may be made therein without departing from the scope and spirit of the invention. It is to be appreciated for instance, that a person skilled in the art may apply the invention disclosed herein to similar embodiments not limited to the following: radio receivers which convert the receive input signal directly to the baseband frequency or radio receivers which contain some variable gain baseband circuitry. Further, it is contemplated that the above described circuit scheme may be employed in a second intermediate frequency stage of a dual intermediate frequency system. Accordingly, modifications such as those suggested above, but not limited thereto, are to be considered within the scope of the invention.

What is claimed is:

1. A radio receiver comprising:
  (a) an input adapted to receive an input radio signal;
  (b) intermediate frequency (IF) means for generating an IF signal from said input radio signal;
  (c) demodulation means coupled to said intermediate frequency means for demodulating said IF signal into an inphase (I) signal and a quadrature (Q) signal; said demodulation means includes:
    (i) first and second mixers for respectively providing said I and Q output signals from said IF signal;
    (ii) first and second DC correction circuits respectively coupled to said first and second mixers and each respectively including a low pass filter, each said first and second DC correction circuits being adapted to respectively store a first DC offset of said first mixer and a second DC offset of said second mixer prior to reception of said input signal and to subtract said first and second DC offsets of said first and second mixers during reception of said input signal;
  (d) switching means for periodically suspending application of said IF signal to said demodulation means, said DC correction circuits sampling said DC offsets during time intervals in which said IF signal is suspended;

wherein said low pass filter of each said DC correction circuit is configured to settle during said time intervals in which said IF signal is suspended, said intermediate frequency means includes a third mixer coupled between said input and said demodulation means and coupled to a local oscillator, and said switching means comprises a first switch coupled between said third mixer and said input and a second switch coupled between said local oscillator and said third mixer, said first and second switches periodically suspending application of said IF signal to said demodulation means.

2. A radio receiver as recited in claim 1, wherein said demodulation means further includes:
  (iii) first and second amplifier means respectively coupled to said first and second DC correction circuits for amplifying the respective output I and Q signals of said first and second DC correction circuits.

3. A radio receiver as recited in claim 2, wherein said demodulation means further includes:
  (iv) first and second analog-to-digital converters respectively coupled to said first and second amplifier means for converting the respective output signals of said first and second amplifier means to digital signals.

4. A radio receiver as recited in claim 3, wherein said input radio signal is received by an antenna and amplified by a low noise amplifier prior to being converted to said IF signal.

5. The radio receiver of claim 1, wherein a noise measurement is performed during suspension of said IF signal, thereby enabling errors in said DC offsets due to noise to be corrected.

6. The radio receiver of claim 1, wherein said input radio signal is periodically received during a predetermined time slot of a frame in a time division multiple access (TDMA) system.

7. A radio receiver comprising:

(a) a low noise amplifier for amplifying an input radio signal;

(b) intermediate frequency means coupled to said low noise amplifier for generating an intermediate frequency (IF) signal from said amplified input radio signal;

(c) demodulation means coupled to said intermediate frequency means for demodulating said IF signal into an inphase (I) signal and a quadrature (Q) signal; said demodulation means including:

(i) first and second mixers for respectively providing said I and Q output signals from said IF signal;

(ii) first and second DC correction circuits respectively coupled to said first and second mixers and each respectively including a low pass filter, each said first and second DC correction circuits being adapted to respectively store a first DC offset of said first mixer and a second DC offset of said second mixer prior to reception of said input signal and to subtract said first and second DC offset signals of said first and second mixers during reception of said input signal;

(iii) first and second amplifier means respectively coupled to said first and second DC correction circuits for amplifying the respective output I and Q signals of said first and second DC correction circuits;

(iv) first and second analog-to-digital converters respectively coupled to said first and second amplifier means for converting the respective output signals of said first and second amplifiers to digital signals;

wherein said intermediate frequency means includes a third mixer coupled to both said low noise amplifier and a local oscillator, said intermediate frequency means further includes a first switch coupled intermediate said low noise amplifier and said third mixer and a second switch coupled intermediate said third mixer and said oscillator, whereby when said first and second switches are in an open position said low pass filter of each said first and second DC correction circuit is caused to settle.

8. A radio receiver as recited in claim 7, wherein said intermediate frequency means further includes an AC capacitor coupling the output signal of said third mixer to said demodulation means.

9. A radio receiver as recited in claim 8, wherein said radio receiver is a quadrature demodulating radio receiver.

10. A radio receiver comprising:

(a) a low noise amplifier for amplifying an input radio signal to provide an amplified input radio signal;

(b) intermediate frequency (IF) means for generating an IF signal from said amplified input radio signal;

(c) demodulation means coupled to said intermediate frequency means for demodulating said IF signal into an inphase (I) signal and a quadrature (Q) signal; said demodulation means includes:

(i) first and second mixers for respectively providing said I and Q output signals from said IF signal;

(ii) first and second DC correction circuits respectively coupled to said first and second mixers and each respectively including a low pass filter, each said first and second DC correction circuits being adapted to respectively store a first DC offset of said first mixer and a second DC offset of said second mixer prior to reception of said input signal and to subtract said first and second DC offsets of said first and second mixers during reception of said input signal;

(d) switching means for periodically suspending application of said IF signal to said demodulation means, said DC correction circuits sampling said DC offsets during time intervals in which said IF signal is suspended;

wherein said low pass filter of each said DC correction circuit is configured to settle during said time intervals in which said IF signal is suspended, said intermediate frequency means includes a third mixer coupled between said low noise amplifier and said demodulation means and coupled to a local oscillator, and said switching means comprises a first switch coupled between said third mixer and said low noise amplifier and a second switch coupled between said local oscillator and said third mixer, said first and second switches periodically opening to suspend application of said IF signal to said demodulation means.

* * * * *